US011231506B2

(12) United States Patent
Datta et al.

(10) Patent No.: US 11,231,506 B2
(45) Date of Patent: Jan. 25, 2022

(54) ULTRAVIOLET (UV) DOSIMETRY

(71) Applicant: Billion Bottle Project, Cleveland, OH (US)

(72) Inventors: Sanjit Datta, New York, NY (US); David Pfau, Westlake, OH (US); Charit Tippareddy, Cleveland, OH (US)

(73) Assignee: BILLION BOTTLE PROJECT, Cleveland, OH (US)

( * ) Notice: Subject to any disclaimer, the term of this patent is extended or adjusted under 35 U.S.C. 154(b) by 221 days.

(21) Appl. No.: 16/570,120

(22) Filed: Sep. 13, 2019

(65) Prior Publication Data

US 2020/0088889 A1    Mar. 19, 2020

Related U.S. Application Data

(60) Provisional application No. 62/731,800, filed on Sep. 14, 2018, provisional application No. 62/731,798, filed on Sep. 14, 2018.

(51) Int. Cl.
*G01T 7/00* (2006.01)
*C02F 1/32* (2006.01)
(Continued)

(52) U.S. Cl.
CPC ............... *G01T 1/026* (2013.01); *C02F 1/32* (2013.01); *G01T 7/00* (2013.01); *H01L 31/0216* (2013.01);
(Continued)

(58) Field of Classification Search
CPC ... G01T 1/026; G01T 7/00; C02F 1/32; C02F 2201/32; C02F 2209/001; C02F 2303/04;
(Continued)

(56) References Cited

U.S. PATENT DOCUMENTS 3,609,093 A    9/1971   Harrah
3,899,677 A    8/1975   Hori et al.
(Continued)

FOREIGN PATENT DOCUMENTS

DE    1971972 U     11/1967
DE    19825416 A1   12/1999
(Continued)

OTHER PUBLICATIONS

International Search Report and Written Opinion for PCT Application No. PCT/US2019/050991, Korean Intellectual Property Office; Republic of Korea; dated Jan. 3, 2020.
(Continued)

*Primary Examiner* — David P Porta
*Assistant Examiner* — Fani Boosalis
(74) *Attorney, Agent, or Firm* — Thomas E. Lees, LLC (57) ABSTRACT

The present disclosure teaches a UV dosimeter comprising a UV-sensitive layer and a barrier that protects the UV-sensitive layer. The barrier is permeable to oxygen but impermeable to water and, thus, protects the UV-sensitive layer from water while allowing exposure of the UV-sensitive layer to oxygen. The UV-sensitive layer is accessible to both UV radiation and visible light. The UV-sensitive layer comprises a mixture of a semiconductor material, a UV-oxidizable dye, a sacrificial electron donor, and a matrix material. The semiconductor material has a band gap that corresponds to photon energy of the UV radiation. The dye has both an oxidation state and a reduction state. The oxidation state of the dye is visibly distinguishable from the reduction state of the dye. The sacrificial electron donor oxidizes when exposed to UV radiation. The matrix provides structural integrity to the mixture.

20 Claims, 6 Drawing Sheets

(51) Int. Cl.
  *G01T 1/02* (2006.01)
  *H01L 31/0216* (2014.01)
  *H01L 31/101* (2006.01)
  *G01J 1/02* (2006.01)

(52) U.S. Cl.
  CPC ........ *H01L 31/101* (2013.01); *C02F 2201/32* (2013.01); *C02F 2209/001* (2013.01); *C02F 2303/04* (2013.01); *C02F 2307/02* (2013.01); *G01J 2001/028* (2013.01)

(58) Field of Classification Search
  CPC ................ C02F 2307/02; H01L 31/101; G01J 2001/028
  See application file for complete search history.

(56) References Cited

U.S. PATENT DOCUMENTS

| | | | |
|---|---|---|---|
| 3,903,423 | A | 9/1975 | Zweig |
| 4,308,459 | A | 12/1981 | Williams |
| 4,763,011 | A | 8/1988 | Smith |
| 5,028,792 | A | 7/1991 | Mullis |
| 5,206,118 | A | 4/1993 | Sidney et al. |
| 5,914,197 | A | 6/1999 | Goudjil |
| 6,060,321 | A | 5/2000 | Hovorka |
| 6,132,681 | A | 10/2000 | Faran et al. |
| 6,294,792 | B1 | 9/2001 | Bazsa et al. |
| 7,589,331 | B2 | 9/2009 | Havens et al. |
| 8,114,673 | B2 | 2/2012 | Mills et al. |
| 8,211,439 | B2 * | 7/2012 | Rosen ............... A61K 31/4439 424/192.1 |
| 8,961,897 | B2 | 2/2015 | Faran |
| 9,658,101 | B1 | 5/2017 | Levine et al. |
| 2001/0019110 | A1 | 9/2001 | Faran et al. |
| 2002/0022008 | A1 | 2/2002 | Forest et al. |
| 2002/0084423 | A1 | 7/2002 | Ferralli |
| 2003/0008409 | A1 | 1/2003 | Spearman et al. |
| 2003/0226978 | A1 | 12/2003 | Ribi et al. |
| 2004/0109789 | A1 | 6/2004 | Faran et al. |
| 2004/0258562 | A1 | 12/2004 | Mills et al. |
| 2008/0014117 | A1 | 1/2008 | Questel et al. |
| 2008/0185534 | A1 | 8/2008 | Simon et al. |
| 2011/0215054 | A1 | 9/2011 | Lantis et al. |
| 2011/0293908 | A1 | 12/2011 | Jeganathan et al. |
| 2012/0137958 | A1 | 6/2012 | Mills et al. |
| 2013/0056425 | A1 | 3/2013 | Lantis et al. |
| 2014/0038305 | A1 | 2/2014 | Sharavara et al. |
| 2014/0225002 | A1 | 8/2014 | Blatchley, III et al. |
| 2017/0304752 | A1 | 10/2017 | Nelson et al. |

FOREIGN PATENT DOCUMENTS

| | | |
|---|---|---|
| EP | 0235863 B1 | 5/1996 |
| GB | 2067060 A | 7/1981 |
| JP | H0656326 B2 | 7/1988 |
| WO | 1993018377 A1 | 9/1993 |
| WO | 1999014573 A1 | 3/1999 |
| WO | 2001038836 A1 | 5/2001 |
| WO | 2001062672 A1 | 8/2001 |
| WO | 02/38447 A2 | 5/2002 |
| WO | 2003021252 A1 | 3/2003 |
| WO | 2005036109 A1 | 4/2005 |
| WO | 2010010321 A1 | 1/2010 |

OTHER PUBLICATIONS

Katherine Lawrie et al.; "UV dosimetry for solar water disinfection (SODIS) carried out in different plastic bottles and bags"; Sensors and Actuators B: Chemical, vol. 208; Mar. 1, 2015.

Robert Copperwhite et al.; "A Camera Phone-Based UV-Dosimeter for Monitoring the Solar Disinfection (SODIS) of Water"; IEEE Sensors Journal; vol. 12, No. 5; May 31, 2012.

* cited by examiner

ULTRAVIOLET (UV) DOSIMETRY

CROSS REFERENCE TO RELATED APPLICATIONS

This application claims the benefit of U.S. provisional patent application Ser. No. 62/731,800, filed on 2018 Sep. 14, and having the title "Submersible Water-Activated Reusable Ultraviolet Dosimeter," by Datta, which is incorporated herein by reference in its entirety. This application also claims the benefit of U.S. provisional patent application Ser. No. 62/731,798, filed on 2018 Sep. 14, and having the title "Reusable Colorimetric Ultraviolet Dosimetry Apparatus," by Datta, which is also incorporated herein by reference in its entirety.

BACKGROUND

Field of the Disclosure

The present disclosure relates generally to dosimetry and, more particularly, to ultraviolet (UV) dosimetry.

Description of Related Art

Solar disinfection (SODIS) relies on ultraviolet (UV) radiation for disinfection. For example, water-borne diseases can be reduced by exposing water to UV radiation. However, to be effective, the amount of UV exposure must be sufficient to neutralize harmful water-borne organisms.

SUMMARY

The present disclosure provides systems and methods for facilitating disinfection with ultraviolet (UV) radiation. Briefly described, this disclosure teaches a UV dosimeter comprising a UV-sensitive layer and a barrier to protect the UV-sensitive layer. The barrier is permeable to oxygen but impermeable to water and, thus, protects the UV-sensitive layer from water while allowing exposure of the UV-sensitive layer to oxygen. The UV-sensitive layer is accessible to both UV radiation and visible light, meaning that both UV radiation and visible light can reach the UV-sensitive layer. The UV-sensitive layer comprises a mixture of a semiconductor material, a UV-oxidizable dye, a sacrificial electron donor, and a matrix material. Preferably, the semiconductor material, the UV-oxidizable dye, the sacrificial electron donor, and the matrix are mixed homogeneously. The semiconductor material has a band gap that corresponds to photon energy of the UV radiation. The dye has both an oxidation state and a reduction state. The oxidation state of the dye is visibly distinguishable from the reduction state of the dye. The sacrificial electron donor oxidizes when exposed to UV radiation. The matrix provides structural integrity to the mixture.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Effects of harmful water-borne organisms can be mitigated by exposing water to ultraviolet (UV) radiation. However, to be effective, the amount of UV exposure should be sufficient to neutralize most, if not all, of the harmful water-borne organisms. In large part, the effectiveness of solar disinfection (SODIS) systems is dependent on the dosage of UV radiation applied.

To overcome some of the drawbacks in conventional SODIS systems, the present disclosure teaches a UV dosimeter, which permits a user to determine whether or not a particular water supply has been exposed sufficiently to UV radiation to render the water safe for consumption. The disclosed UV dosimeter comprises a UV-sensitive layer, which provides a visual indicator of whether or not there has been sufficient exposure to UV radiation. Thus, if the water supply has received sufficient UV exposure, then the UV-sensitive layer changes its visual appearance. The visual appearance of the UV-sensitive layer is reversible, thereby allowing the UV dosimeter to be reusable.

In some embodiments, the UV dosimeter comprises a barrier that protects the UV-sensitive layer. The barrier is permeable to oxygen but impermeable to water and, thus, protects the UV-sensitive layer from water while allowing exposure of the UV-sensitive layer to oxygen. The UV-sensitive layer comprises a UV-oxidizable dye, which has both an oxidation state and a reduction state. The oxidation state of the dye is visibly distinguishable from the reduction state of the dye. Thus, when exposed to sufficient UV radiation, the UV-oxidizable dye oxidizes and changes its visual appearance to indicate sufficient exposure to UV radiation. The visual appearance is reversed by reducing the UV-oxidizable dye, for example, by using an oxygen-based reducing mechanism. Providing a UV dosimeter with visually distinguishable oxidation and reduction states allows for easier application of SODIS. Furthermore, providing a reversible mechanism permits reuse of the UV dosimeter.

Figure 1:
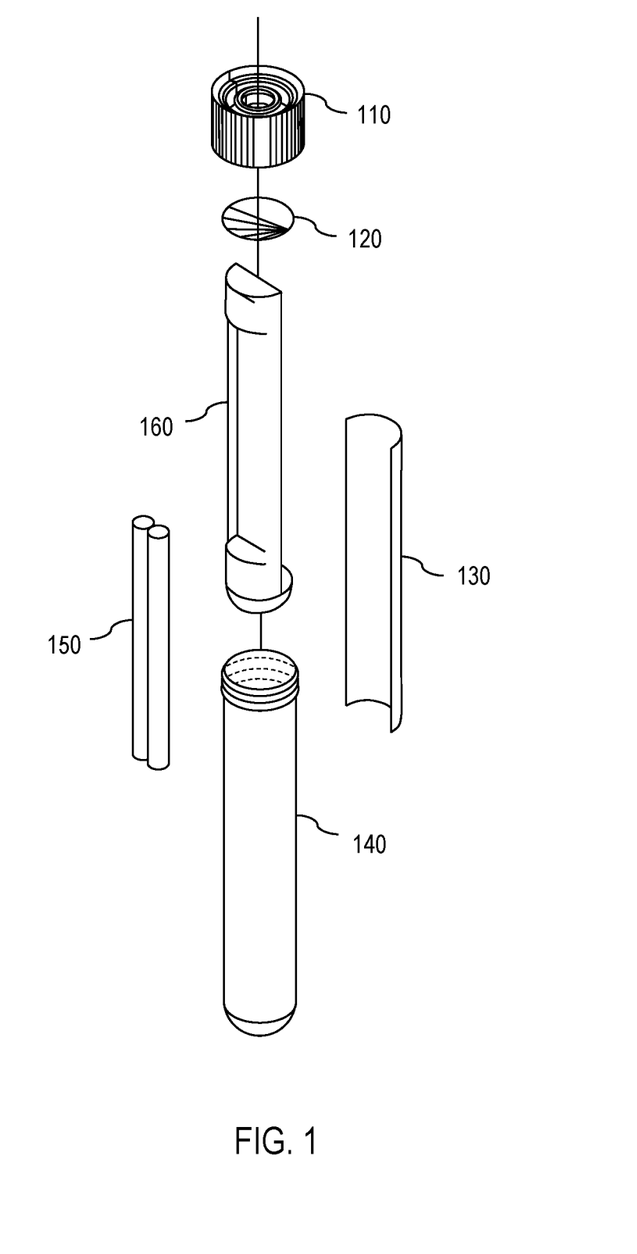
FIG. 1 is a diagram showing an exploded view of one embodiment of an apparatus for solar disinfection (SODIS) of water.
Figure 2:
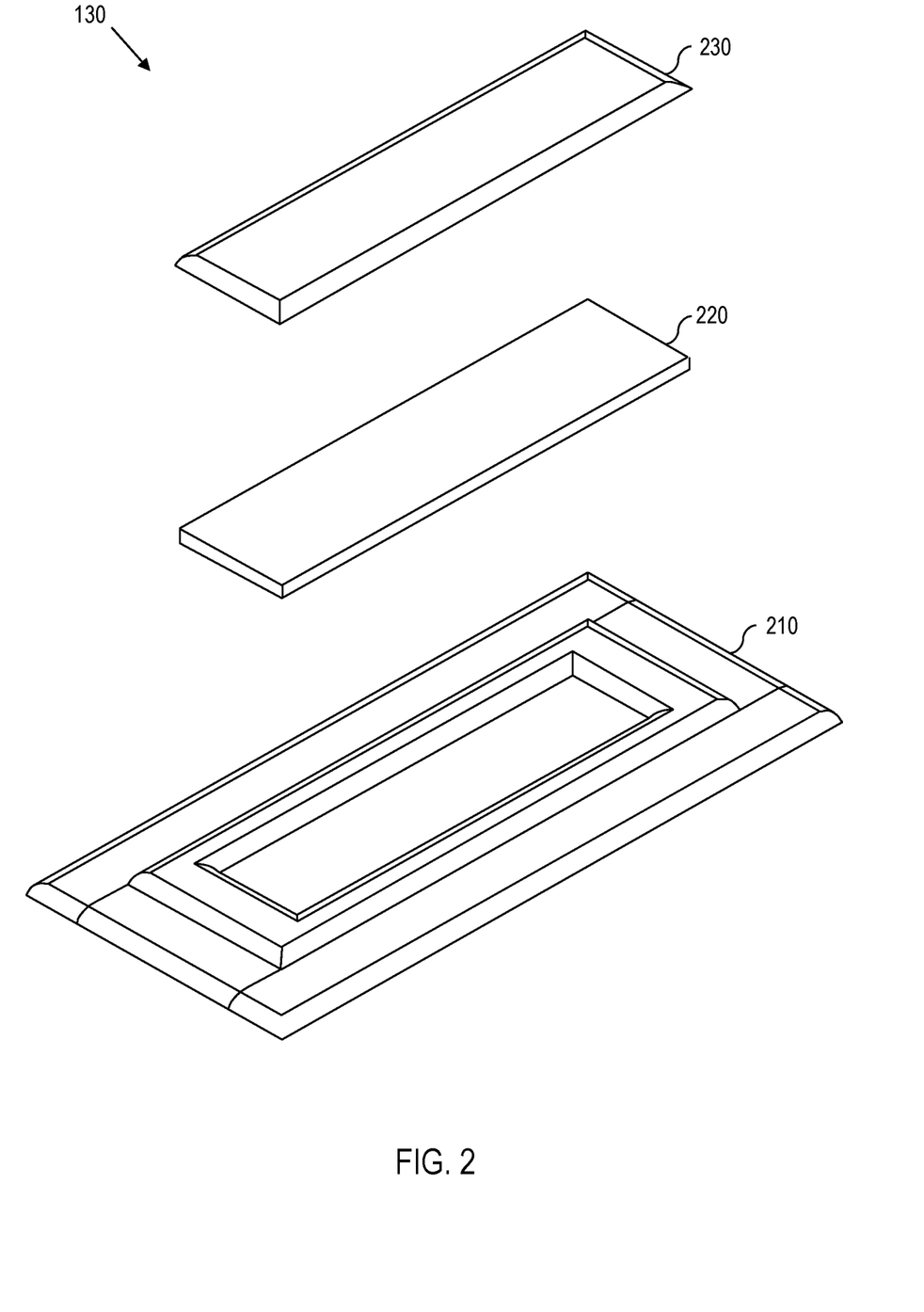
FIG. 2 is a diagram showing an exploded view of one embodiment of an ultraviolet (UV) dosimeter.
Figure 3A:
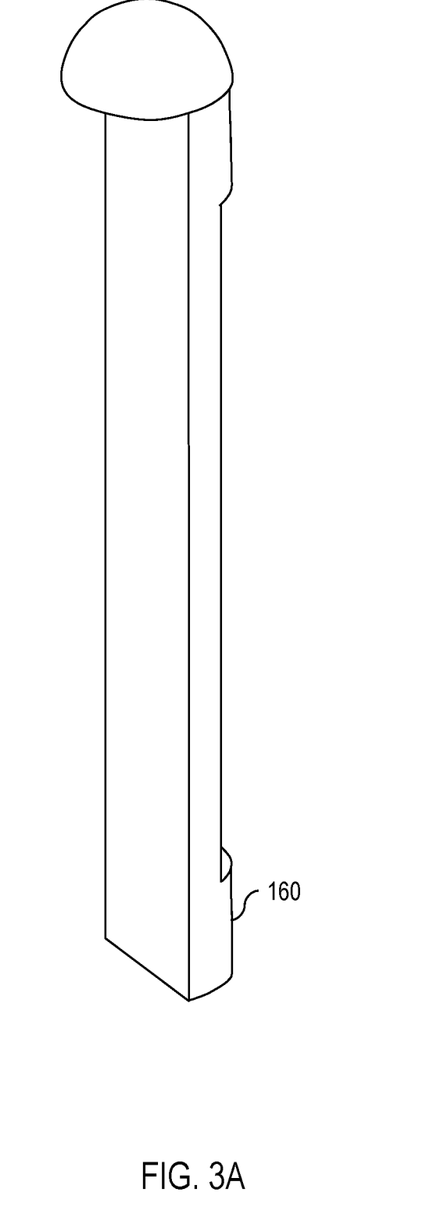
FIG. 3A is a diagram showing the isolating insert of FIG. 1 in greater detail.
Figure 3B:
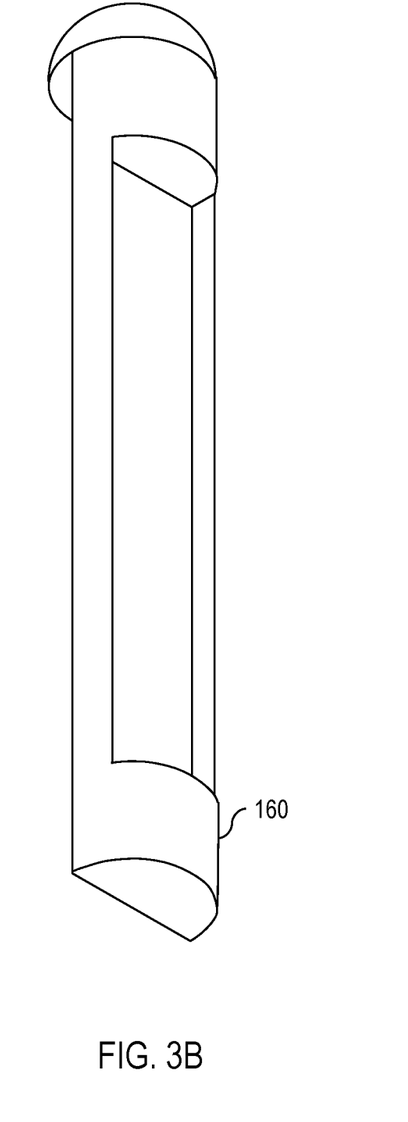
FIG. 3B is a diagram showing the isolating insert of FIG. 3A from a different angle.
Figure 4:
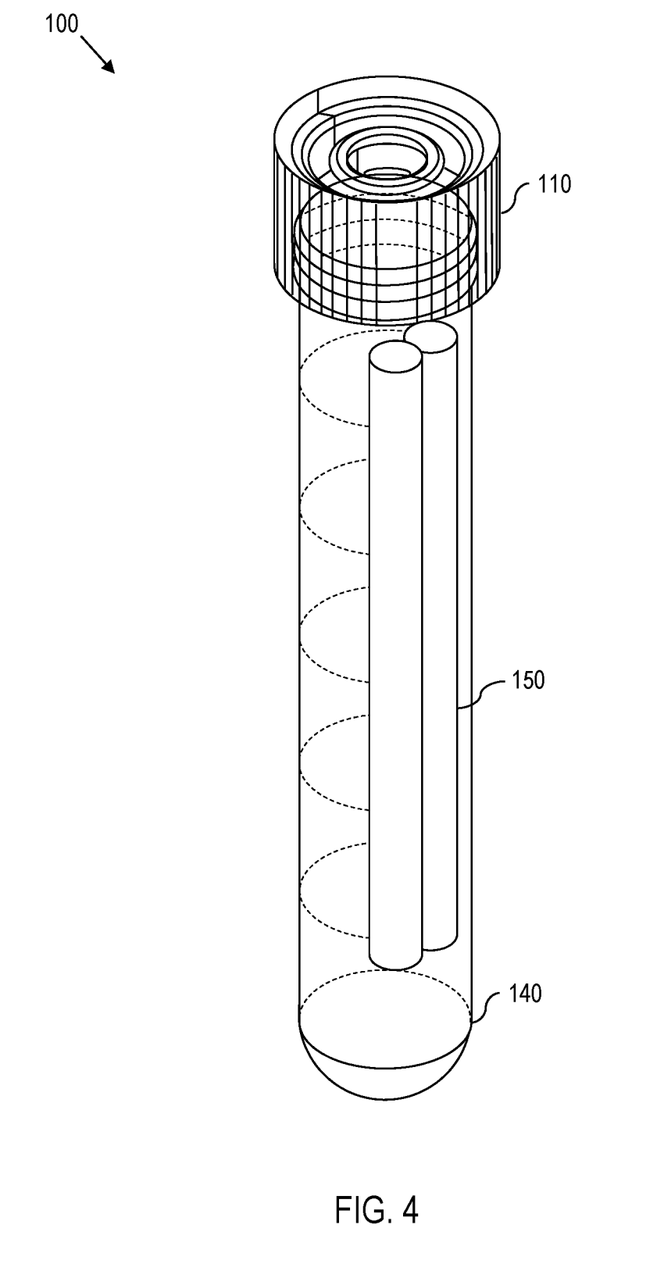
FIG. 4 is a diagram showing an assembled view of the SODIS apparatus of FIG. 1.
Figure 5:
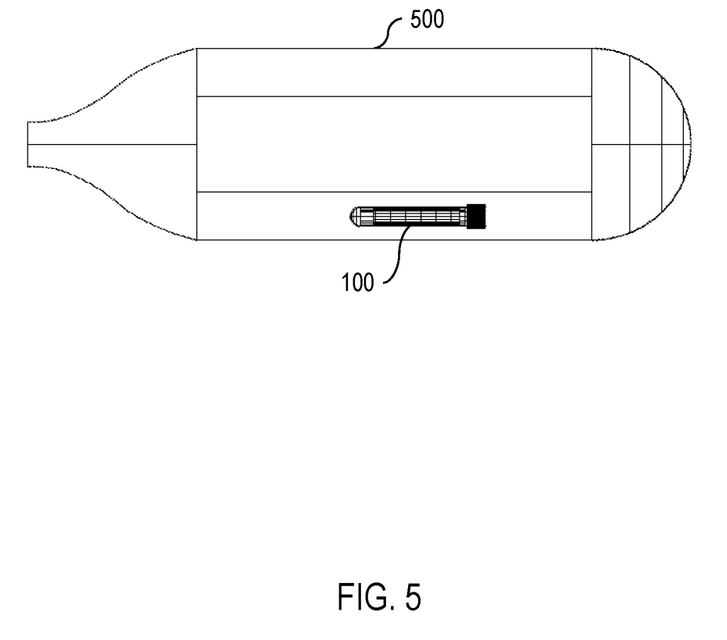
FIG. 5 is a diagram showing the SODIS apparatus of FIGS. 1 and 4 as used in a water bottle.

Having provided a broad technical solution to a technical problem, reference is now made in detail to the description of the embodiments as illustrated in the drawings. Specifically, FIGS. 1 and 4 show one embodiment of an apparatus 100 for SODIS; FIG. 2 shows one embodiment of a reusable UV dosimeter 130; FIGS. 3A and 3B show one embodiment of an isolating insert 160; and FIG. 5 shows one embodiment of a water bottle 500 in which the SODIS apparatus 100 is used. Although several embodiments are described in connection with these drawings, there is no intent to limit the disclosure to the embodiment or embodiments disclosed herein. On the contrary, the intent is to cover all alternatives, modifications, and equivalents.

With this in mind, attention is turned to FIGS. 1 and 4, which show an exploded view and an assembled view, respectively, of one embodiment of a SODIS apparatus 100. As shown in FIGS. 1 and 4, the apparatus 100 comprises a cap 110, a membrane 120, a UV dosimeter 130, a vessel 140, a weight 150, and an isolating insert 160. The vessel 140 (also denoted as a casing or a housing) has vessel walls that are at least partially transparent to both visible light and to UV radiation. In other words, the vessel 140 permits entry of both UV radiation and visible light. The membrane 120 is permeable to oxygen but impermeable to water, thereby permitting exposure of the contents of the vessel 140 to oxygen but preventing water from reaching the contents of the vessel 140. The UV dosimeter 130 and weight 150 are placed in the vessel 140 separated by the isolating insert 160. Thereafter, the membrane 120 is secured to the top of the vessel 140 by a cap 110. The cap 110 comprises a hole through which air (and thus, oxygen) can pass through the membrane 120 to reach the contents of the vessel 140.

Continuing, FIG. 5 shows one embodiment of the apparatus 100 inserted into a partially-transparent bottle 500 full of water. As shown in FIG. 5, the weight 150 in the vessel 140 causes the apparatus 100 to sink. Furthermore, because the weight 150 is isolated from the UV dosimeter 130 by the isolating insert 160, the weight 150 causes the apparatus 100 to turn when submerged in the water so that the side of the apparatus 100 with the weight 150 faces the bottom of the bottle 500 while the side of the apparatus 100 with the UV dosimeter 130 faces away from the bottom of the bottle 500. This permits the UV dosimeter 130 to experience more consistent exposure to UV radiation. One embodiment of the isolating insert 160 is shown in FIGS. 3A and 3B.

Also, because the membrane 120 is impermeable to water, when the apparatus 100 is submerged and fully surrounded by water, the water forms a barrier around the apparatus 100, thereby isolating the contents of the vessel 140 from any air supply (and, thus, any oxygen supply) that was not already in the vessel 140 prior to submersion. Conversely, if the apparatus 100 is removed from the water, then the water no longer forms a barrier, thereby permitting air (and oxygen) to enter the vessel 140 through the oxygen-permeable barrier 120.

If the UV dosimeter 130 oxidizes in the presence of UV radiation and reduces in the presence of oxygen, then UV exposure can be measured from the oxidation-reduction state of the UV dosimeter 130. Furthermore, if the oxidation state appears visually different from the reduction state (e.g., different color, etc.), then UV exposure can be determined through visual inspection of the UV dosimeter 130.

By way of example, if the apparatus 100 is submerged in water and exposed to UV radiation (e.g., sunlight), then the UV dosimeter 130 oxidizes and changes color. Because the UV dosimeter 130 is isolated from a supply of oxygen when the apparatus 100 is submerged, the oxidation-reduction reaction proceeds mainly in one direction (namely, oxidation). If, on the other hand, the apparatus 100 is removed from the water, then the UV dosimeter 130 becomes exposed to a fresh supply of air (and oxygen) and the oxidation-reduction reaction proceeds in the other direction (namely, reduction). The reduced UV dosimeter 130 then reverts back to its initial color.

One embodiment of an oxidation-reduction-dependent UV dosimeter 130 is shown with reference to FIG. 2. In the embodiment of FIG. 2, the UV dosimeter 130 comprises a substrate 210, a UV-sensitive layer 220 located on the substrate 210, and a barrier 230 that protects the UV-sensitive layer 220. The barrier 230 is permeable to oxygen but impermeable to water, similar to the oxygen-permeable-but-water-impermeable membrane 120. Thus, when the barrier 230 is placed on the UV-sensitive layer 220, the barrier 230 prevents water from contacting the UV-sensitive layer 220 while permitting oxygen from reaching the UV-sensitive layer 220. It should be appreciated that, for other embodiments, the UV-sensitive layer 220 is sealed with a removable cover to allow selective exposure of the UV-sensitive layer 220 to oxygen (or air) by selectively removing the cover and then re-covering the UV-sensitive layer 220 with the removable cover. In other words, what is relevant is the ability to selectively expose the UV-sensitive layer 220 to oxygen (air) or prevent exposure to oxygen (air), depending on whether an oxidation state or a reduction state is desired (as explained in greater detail below).

Because the vessel 140 is partially transparent to both UV radiation and visible light, the vessel permits both UV radiation and visible light to reach the UV-sensitive layer 220. In other words, the UV-sensitive layer 220 is accessible (or exposable) to both UV radiation and visible light. It should be appreciated that, because the UV-sensitive layer 220 is located between the substrate 210 and the barrier 230, either the substrate 210 or the barrier 230 (or both) must be partially transparent to UV radiation and visible light, thereby allowing both UV radiation and visible light access to the UV-sensitive layer 220.

For some embodiments, the substrate 210 comprises a clear, flexible plastic sheet that provides structural rigidity. Preferably, the substrate 210 attenuates a large fraction of the UV radiation but attenuates only a small fraction of the visible light. It should be appreciated that a substrate 210 with different UV attenuation properties can be selected, thereby permitting controlled exposure to UV and controlled UV sensitivity. Also, it should be appreciated that the substrate 210 can have varying UV attenuation properties (e.g., graded index across the substrate 210, step-wise variation across the substrate 210, etc.), thereby allowing for different amounts of UV exposure through the substrate.

Similarly, for some embodiments, the barrier 230 can also be selected for different UV attenuation properties, thereby permitting controlled exposure to UV and controlled UV sensitivity through the barrier 230. Thus, if the barrier 230 has varying UV attenuation properties (e.g., graded index, step-wise variation, etc.), then different amounts of UV exposure can be detected through the barrier 230.

For some embodiments, the UV-sensitive layer 220 comprises a mixture of semiconductor material, a UV-oxidizable dye, a sacrificial electron donor, and a matrix. These components permit the UV-sensitive layer 220 to change its visual appearance (e.g., change color) when exposed to a predetermined dose of UV radiation and to revert back to its initial visual appearance when exposed to oxygen.

The semiconductor material has a band gap that corresponds to photon energy of the UV radiation. Thus, the semiconductor material permits absorption of the UV radiation that encounters the UV-sensitive layer 220. Because the concentration of the semiconductor material is proportional to UV absorption, the concentration of semiconductor material provides a method for controlling the dosage at which the UV-sensitive layer 220 changes its visual appearance. For some embodiments, the semiconductor material comprises titanium dioxide particles, zinc oxide particles, tin oxide particles, or various combinations thereof. The semiconductor material is dispersed throughout the UV-sensitive layer 220 in the form of nanoparticles, microparticles, aggregates (or microaggregates) of nanoparticles, or other suitable forms. For some embodiments, a suitable concentration of semiconductor particles ranges from approximately 0.0001 percent (~0.0001%) to ~5% by weight of the UV-sensitive layer 220.

The UV-oxidizable dye changes its appearance based on its oxidation-reduction state. Thus, for some embodiments, the UV-oxidizable dye is one color when oxidized and a different color when reduced. One such example is methylene blue, which is biocompatible and therefore suitable as an indicator for drinking water. For some embodiments, a suitable concentration of UV-oxidizable dye ranges from ~0.001% to ~0.1% by weight of the UV-sensitive layer 220. Insofar as UV-oxidizable dyes exhibit UV-dose-dependent behavior, a higher concentration of UV-oxidizable dye will change its appearance with a higher dose of UV radiation, while a lower concentration of UV-oxidizable dye will change its appearance with a lower dose of UV radiation. Thus, the concentration of UV-oxidizable dye also provides a method for controlling the dosage at which the UV-sensitive layer 220 changes its visual appearance (e.g., changes its color).

When exposed to UV radiation, the sacrificial electron donor oxidizes in the presence of the semiconductor material, thereby donating its electron to the UV-oxidizable dye. One example of a sacrificial electron donor is glycerol, which becomes irreversibly oxidized when exposed to UV radiation. Other examples of sacrificial electron donors include cellulose (e.g., hydroxyethyl cellulose, ethyl cellulose, etc.), sodium iodide (or some other inorganic reducing agent), triethanolamine, ascorbic acid, etc. Because the sacrificial electron donor is typically irreversibly oxidized, a high concentration of sacrificial electron donors provides a longer time to depletion and, consequently, permits greater reusability of the UV-sensitive layer 220. For some embodiments, the concentration of the sacrificial electron donor is between ~10% and ~50% by weight of the UV-sensitive layer 220.

The matrix material provides structural integrity to the UV-sensitive layer 220. Thus, it should be appreciated that, for some embodiments, if the matrix material imparts sufficient structural integrity to the UV-sensitive layer 220, then the substrate 210 is no longer necessary. Examples of matrices with structural integrity include, for example, latex or other types of resins. In other words, for some embodiments, the substrate 210 is optional. For some embodiments, the matrix material is a either a water-soluble polymeric matrix material (e.g., polyvinyl acetate, polyvinyl alcohol, etc.) or a water-insoluble polymeric matrix material (e.g., epoxy, polyester, etc.). It should also be appreciated that other materials, such as, for example, natural resin (e.g., Canada balsam) or some type of microparticle immersion (e.g., latex), may be used for the matrix material. For some embodiments, the matrix material is a cellulose (or a cellulose derivative), in which case the matrix material can be coextensive with the sacrificial electron donor. In other words, the sacrificial electron donor and the matrix material need not be different materials. For some embodiments, a suitable concentration of the matrix material ranges from ~1% to ~50% by weight of the UV-sensitive layer 220. At bottom, the concentration of matrix material forms the remaining balance (by weight) of the UV-sensitive layer 220.

For some embodiments, the semiconductor material, the UV-oxidizable dye, the sacrificial electron donor, and the matrix material are mixed homogeneously using ultrasonic homogenization using water as a solvent. It should be appreciated that other solvents can also be used. However, using water as a solvent reduces undesirable residue in the final homogenized UV-sensitive layer 220. It should be appreciated that other homogenization processes can be used, such as, for example, blending, mixing, vortexing, etc. Upon homogenization, the UV-sensitive layer 220 is drop cast onto the substrate 210 and, thereafter, set using known drying processes.

As shown in FIGS. 1 through 5, because the oxidation state of the UV-oxidizable dye is reversible, the UV dosimeter 130 is reusable until the sacrificial electron donor has been effectively depleted of its electrons. Furthermore, because the oxidation and reduction states of the UV dosimeter 130 can be distinguished based on visual appearance, the disclosed UV dosimeter 130 provides a more robust approach to determining when a water supply has received sufficient UV exposure for SODIS. Additionally, because many of the underlying components of the UV dosimeter 130 are UV-dose dependent, the disclosed UV dosimeter 130 provides an elegant approach to repeated measurements of UV exposure or UV dosage.

Any process descriptions should be understood as representing steps in the process and, thus, it should be understood that alternative implementations are included within the scope of the preferred embodiment of the present disclosure. It should also be appreciated that process steps may be executed out of order from that shown or discussed, including substantially concurrently or in reverse order, depending on the functionality involved, as would be understood by those reasonably skilled in the art of the present disclosure.

Although exemplary embodiments have been shown and described, it will be clear to those of ordinary skill in the art that a number of changes, modifications, or alterations to the disclosure as described may be made. All such changes, modifications, and alterations should therefore be seen as within the scope of the disclosure.

What is claimed is:

1. An apparatus comprising:
   a vessel having a vessel wall, the vessel wall being at least partially transparent to visible light, the vessel wall further being at least partially transparent to ultraviolet (UV) radiation;
   a membrane secured to the vessel, the membrane being permeable to oxygen, the membrane being impermeable to water, the membrane for preventing water ingress to the vessel; and
   a dosimeter located within the vessel, the dosimeter for detecting a dosage of the UV radiation, the dosimeter being reusable, the dosimeter comprising:
      a substrate;
      a UV-sensitive layer accessible to the UV radiation, the UV-sensitive layer being located on the substrate, the UV-sensitive layer comprising:
         a first concentration of semiconductor material having a band gap, the band gap corresponding to photon energy of the UV radiation, the semiconductor material being homogeneously distributed in the UV-sensitive layer, the first concentration being between approximately 0.0001% and approximately 5% by weight of the UV-sensitive layer, the semiconductor material being one selected from the group consisting of:
            titanium dioxide particles;
            zinc oxide particles; and tin oxide particles;

a second concentration of a UV-oxidizable dye, the UV-oxidizable dye having an oxidation state and a reduction state, the UV-oxidizable dye having a first color in the oxidation state, the UV-oxidizable dye having a second color in the reduction state, the first color being distinguishable from the second color, the UV-oxidizable dye being homogeneously distributed in the UV-sensitive layer, the second concentration being between approximately 0.001% and approximately 0.1% by weight of the UV-sensitive layer;

a third concentration of an irreversibly oxidizable sacrificial electron donor, the irreversibly oxidizable sacrificial electron donor being homogeneously distributed in the UV-sensitive layer, the irreversibly oxidizable sacrificial electron donor for oxidation when exposed to the UV radiation, the third concentration being between approximately 10% and approximately 50% by weight of the UV-sensitive layer, the irreversibly oxidizable sacrificial electron donor being one selected from the group consisting of:

a cellulose;
glycerol;
hydroxyethyl cellulose;
ethyl cellulose;
sodium iodide;
an inorganic reducing agent;
triethanolamine; and
ascorbic acid;

a fourth concentration of a polymeric matrix material, the polymeric matrix material being homogeneously distributed in the UV-sensitive layer, the fourth concentration being between approximately 1% and approximately 50% by weight of the UV-sensitive layer; and a barrier for protecting the UV-sensitive layer, the barrier being located on the UV-sensitive layer, the barrier being permeable to oxygen, the barrier being impermeable to water.

2. The apparatus of claim 1, wherein the dye is methylene blue.

3. The apparatus of claim 1, wherein the polymeric matrix material is a water-soluble polymeric matrix material.

4. The apparatus of claim 3, wherein the water-soluble polymeric matrix material is one selected from the group consisting of:

polyvinyl acetate; and
polyvinyl alcohol.

5. The apparatus of claim 1, wherein the polymeric matrix material is a water-insoluble polymeric matrix material.

6. The apparatus of claim 1, wherein the polymeric matrix material is a cellulose.

7. An apparatus comprising:

an ultraviolet (UV) sensitive layer accessible to UV radiation, the UV-sensitive layer further being accessible to visible light, the UV-sensitive layer comprising a mixture of:

a first concentration of a semiconductor material having a band gap that corresponds to photon energy of the UV radiation;

a second concentration of a UV-oxidizable dye having an oxidation state and a reduction state, the oxidation state being visibly distinguishable from the reduction state;

a third concentration of a sacrificial electron donor for oxidation when exposed to the UV radiation; and a fourth concentration of a matrix material; and a barrier for protecting the UV-sensitive layer, the barrier being permeable to oxygen but impermeable to water.

8. The apparatus of claim 7, further comprising:

a vessel to house the UV-sensitive layer and the barrier, the vessel being at least partially transparent to the visible light, the vessel further being at least partially transparent to the UV radiation; and a membrane secured to the vessel, the membrane being permeable to oxygen, the membrane being impermeable to water, the membrane for preventing water ingress to the vessel.

9. The apparatus of claim 7, further comprising a substrate on which the UV-sensitive layer is located, the substrate being partially transparent to both UV radiation and to visible light.

10. The apparatus of claim 7, wherein the barrier is partially transparent to both UV radiation and to visible light.

11. The apparatus of claim 7, wherein the semiconductor material has a band gap that corresponds to photon energy of the UV radiation.

12. The apparatus of claim 7, wherein the semiconductor material, the UV-oxidizable dye, the sacrificial electron donor, and the matrix are homogeneously distributed within the UV-sensitive layer.

13. The apparatus of claim 7, wherein the first concentration is between approximately 0.0001% and approximately 5% by weight of the UV-sensitive layer.

14. The apparatus of claim 7, wherein the semiconductor material is one selected from the group consisting of:

titanium dioxide particles;
zinc oxide particles; and
tin oxide particles.

15. The apparatus of claim 7, wherein the second concentration is between approximately 0.001% and approximately 0.1% by weight of the UV-sensitive layer.

16. The apparatus of claim 7, wherein sacrificial electron donor is an irreversibly oxidizable sacrificial electron donor.

17. The apparatus of claim 7, wherein the sacrificial electron donor oxidizes when exposed to the UV radiation.

18. The apparatus of claim 7, wherein the third concentration is between approximately 10% and approximately 50% by weight of the UV-sensitive layer.

19. The apparatus of claim 7, wherein the sacrificial electron donor is one selected from the group consisting of:

a cellulose;
glycerol;
hydroxyethyl cellulose;
ethyl cellulose;
an inorganic reducing agent;
sodium iodide;
triethanolamine; and
ascorbic acid.

20. The apparatus of claim 7, wherein the fourth concentration is between approximately 1% and approximately 50% by weight of the UV-sensitive layer.

* * * * *